(12) United States Patent
Genova et al.

(10) Patent No.: US 6,507,227 B2
(45) Date of Patent: Jan. 14, 2003

(54) DEVICE AND METHOD FOR MONITORING CURRENT DELIVERED TO A LOAD

(75) Inventors: Angelo Genova, Delia (IT); Roberto Gariboldi, Lacchiarella (IT); Aldo Novelli, Parabiago (IT); Giulio Ricotti, Broni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/948,144

(22) Filed: Sep. 6, 2001

(65) Prior Publication Data

US 2002/0063573 A1 May 30, 2002

(30) Foreign Application Priority Data

Sep. 7, 2000 (IT) .......................................... VA00A0031

(51) Int. Cl.$^7$ ................................................. H03K 3/01
(52) U.S. Cl. ....................... 327/109; 327/312; 327/362; 327/512; 327/584; 327/361; 327/100; 327/101; 327/91.5
(58) Field of Search .................................. 327/109, 312, 327/362, 512, 584; 361/100, 101, 91.5

(56) References Cited

U.S. PATENT DOCUMENTS 5,272,392 A * 12/1993 Wong et al. ................. 327/109

* cited by examiner

*Primary Examiner*—Michael Tokar
*Assistant Examiner*—Vibol Tan
(74) *Attorney, Agent, or Firm*—Lisa K. Jorgenson; Allen, Dyer, Doppelt, Milbrath & Gilchrist, P.A.

(57) ABSTRACT

The device and method monitor the current delivered to a load through a power transistor including a sense transistor. The circuit includes a disturbances attenuating circuit that has a differential stage, and first, second and third stages referenced to ground, the respective input nodes of which are connected in common to an output node of the differential stage. The third stage is formed by a transistor identical to a transistor of the first stage and delivers a current signal through a current terminal thereof, proportional to the current being delivered to the load.

26 Claims, 12 Drawing Sheets

DEVICE AND METHOD FOR MONITORING CURRENT DELIVERED TO A LOAD

FIELD OF THE INVENTION

The present invention relates to circuits and associated methods for monitoring current in a load, and, more particularly to a circuit for detecting the current delivered to a load by a power transistor, with reduced noise sensibility.

BACKGROUND OF THE INVENTION

Circuits for detecting the current circulating in a load are commonly associated with output power stages and are necessary components for implementing a desired control and regulation. According to common switching mode driving techniques, current is fed to a load through one or more power transistors (switches) coupling the load to the supply.

For sake of simplicity, consider the case in which a load is driven through a high-side N-channel power MOS transistor, although the following discussion is also applicable to the case of a load driven by a power device of a different kind and/or in a different configuration. A typical circuit used for sensing the current circulating in the load is the one depicted in FIG. 1. A load connected to an output node OUT is coupled to the supply node VS via a power transistor 1, (NMOS_POWER). Usually, an sense transistor 2, NMOS_POWER_$_{iSENSE}$, producing a replica current scaled by a factor n of the current circulating in the true power device NMOS_POWER, is associated to it. Such a sense transistor is of the same type of and connected in parallel to the power transistor but has a much smaller size than the latter.

The value of the current circulating in the load can be determined by sensing with a differential amplifier 4 (D$_{IFF\_}$ A$_{MPL}$), the voltage drop on a sensing resistance 3 (R$_{SENSE}$) connected in series to the sense transistor 2. Resistor 3 must be dimensioned in function of the design current that circulates in it and to the expected voltage drop on it and it must have a resistance smaller than the interval resistance R$_{ON}$ of the sense transistor 2. The order of magnitude of the voltage drop on the nodes of the sensing resistance 3 may be of tens or hundreds of millivolts and is normally sensed via an operational amplifier 4.

The degree of precision of this solution is rather coarse. In fact the voltage sensed on the resistance 3 is sensible to the process spread of the values of the resistance 3 and of R$_{ON}$ of transistor 2. Burdensome trimming operations, when testing the device, are required to obtain a precision of at least 1%. Moreover, the amplifier 4 is sensitive to substrate noise even if subject to relatively small current injections, that may unbalance the input differential stage causing large variations of the output.

Consider, for example, the case of the half-bridge architecture of FIG. 2, that is the architecture typically used for driving a load via two DMOS power transistors. When the DMOS 6 is turned on and the DMOS 7 is turned off, the current on the external inductor increases as shown in FIG. 2. On the contrary, when the DMOS 6 is turned off, the current circulates in the intrinsic diode, constituted by the drain diffusion of the DMOS and the P type substrate, and in diode 8 constituted by the N type drain diffusion of the DMOS and the P type body diffusion.

The turning on of the diode 9 may cause the turn on of the parasitic NPN transistor 10 depicted in FIG. 3, whose emitter is constituted by the N type drain diffusions of the DMOS, whose base is constituted by the P type diffusion of the substrate and whose collectors are the N type epitaxial regions. If, for example, the amplifier 4 has a PNP input stage, because the base of the PNP transistors of the comparator coincides with the epitaxial regions, a current injected by the parasitic transistor 10 in this base region may unbalance the differential amplifier 4 of the architecture of FIG. 1.

Another drawback affecting this circuit includes the fact that it is not immune from the current spikes that are produced when the NMOS_POWER_H_SIDE transistor turns on. Referring to FIG. 4, should the DMOS 6 turn on while current is recirculating in diodes 8 and 9, the charges stored in diodes 8 and 9 ("storage charges") are discharged producing a current spike, whose direction is depicted in FIG. 5. These current spikes last several hundreds of nanoseconds and must be masked, to prevent generation of relevant undesired effects at the output. To this end, blanking circuits must be added for blocking the differential amplifier 4 of FIG. 1 during this phase, or the amplifier 4 should have a slow response.

In the first case there is a time interval in which there is no signal for controlling the current delivered to the load. In the second case it is necessary to choose an amplifier having a dynamic response sufficiently slow to make it substantially insensitive to current spikes, though sufficiently fast to effectively track normal load variations.

SUMMARY OF THE INVENTION

It is an object of the invention to provide a circuit for monitoring the current delivered to a load that is not burdened by the above mentioned drawbacks, and that couples an outstanding precision even in presence of a considerable process spread to an excellent dynamic response.

Different from known circuits, the circuit of the invention does not require the introduction of a masking interval, that limits the speed of intervention of the circuit. In fact, the circuit of this invention has a fast dynamic response capable of following the variations of the current being delivered to the load, though it is relatively insensitive to the exceptionally fast variations due to spurious current spikes.

According to the invention, these results are achieved by coupling a disturbances attenuating circuit to the sense transistor and to the power transistor driving the load. The disturbances attenuating circuit is able to produce a current signal proportional to the current circulating in the load that is relatively free of disturbances. According to a preferred embodiment, the disturbances attenuating circuit is realized with MOS transistors.

The circuit of the invention may be used in a monitoring system for detecting eventual overcurrents circulating in a load driven by a power transistor. Such a system is obtained by connecting in cascade to the disturbances attenuating circuit a comparator that compares the current signal produced by the disturbances attenuating circuit with a threshold current. The comparator produces a warning logic signal whenever the signal surpasses the threshold.

A further object of the invention is to provide a system for regulating the current delivered to the load, realized by connecting in cascade to the disturbances attenuating circuit a trans-impedance amplifier, input with the current signal produced by the disturbances attenuating circuit and with a reference signal and producing a driving signal of the power transistor that drives the load.

BRIEF DESCRIPTION OF THE DRAWINGS

The different aspect and advantages of the invention will appear even more evident through a description of a number of embodiments and by referring to the attached drawings, wherein:

FIG. 3 is schematic diagram illustrating the operation of the half-bridge of FIG. 2 when a parasitic transistor NPN turns on.

DETAILED DESCRIPTION OF THE PREFERRED EMBODIMENTS

Solely for illustrative purposes, the invention is applied to the case of a power transistor delivering a current to a load, to which a sense transistor for generating a scaled replica of the current circulating in the power transistor is associated. Such a replica current is unavoidably affected by disturbances that affect the current passing through the power transistor, therefore it does not provide a precise estimation of the current flowing in the load. For this reason the information provided by the replica current may often need to be corrected in case of applications requiring an enhanced precision of control.

Figure 6:
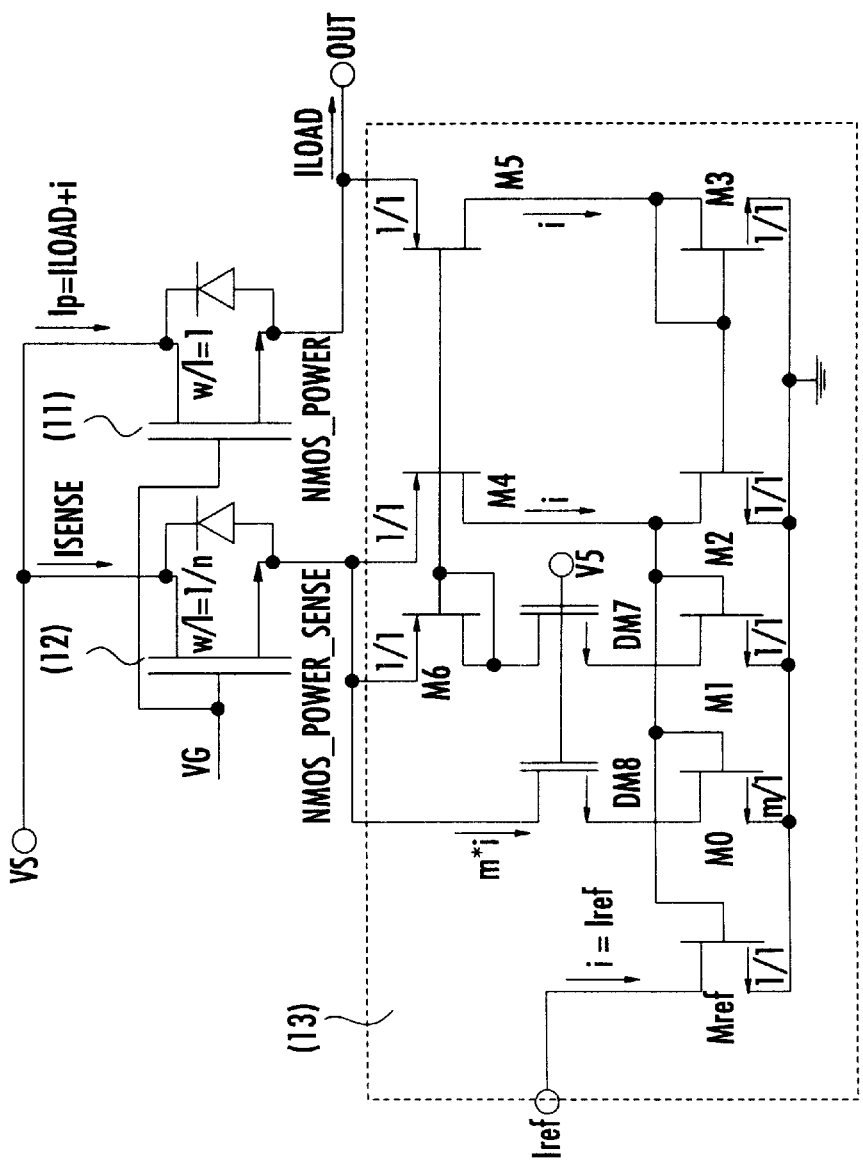
FIG. 6 is a schematic diagram depicting a preferred embodiment of the circuit of the invention.

FIG. 6 depicts a power transistor NMOS_POWER 11 feeding a load, substantially in parallel with a sense transistor NMOS_POWER_sense 12. According to the present invention, the two transistors are coupled to a disturbances attenuating circuit 13 and produce a relatively disturbance-free current signal proportional to the load current. In the depicted example, the disturbances attenuating circuit 13 of FIG. 6 is made with CMOS devices, but it may even be conveniently realized with bipolar junction transistors (BJT).

To illustrate in a very easy manner the operation of the circuit of FIG. 6, a certain current, Iload, is delivered to a load. The differential stage M4, M5, M2, M3, formed a first pair of identical transistors M4 and M5 and a second pair of mirrored identical transistors M2 and M3, sets the source voltages of the DMOS transistors 11 and 12 at the same value, so the current in the DMOS 12 is (Iload+i)/n, wherein n is the mirror ratio of devices 11 and 12 and i is the current circulating in MOS transistors M5 and M3.

The diode-connected transistor M6 is identical to M4 and M5, and it is mirrored to them such that a current i circulates in it. The NMOS transistors M1, M2, M3 and M$_{REF}$ are identical and have the same gate voltage, thus the same current i circulates in them, while a current m×i circulates in the transistor M0, which has an aspect ratio m times greater than the aspect ratio of M3.

By referring to the current indicated in FIG. 6:
Current flowing in device 11:

$$Ip = Iload + i; \quad (1)$$

Current flowing in device 12:

$$Isense = Ip/n = (Iload+i)/n; \quad (2)$$

The current circulating in device 12 divides itself through the branches containing the transistors M1, M2 and M0, respectively. The current circulating in each branch is:

$$Iref = i = Isense/(m+2); \quad (3)$$

Considering equation (1):

$$(m+2) \times i = (Iload+i)/n;$$

thus $$Iref = i = Iload/((m+2) \times n - 1); \quad (4)$$

In particular, if m, n >> 1:

$$Iref = i = Iload/((m+2) \times n); \quad (5)$$

Therefore, the current Iref is a fraction of the load current Iload and depends only on the aspect ratios of MOS M0 and M1 and of the power DMOS 11 and the sense DMOS transistor 12.

A great advantage of the present approach in respect to the prior art techniques is the enhanced precision with which such a current Iref is produced. It depends only from the load current and from aspect ratios of transistors and is independent from actual values of integrated parameters of components, such as the current sensing resistance and the internal resistance R$_{ON}$ of the DMOS transistors.

The cascode stage DM7, DM8 is used only for letting the transistors M0 and M1 work at a low voltage. Of course, the circuit of the invention may be realized even without the cascode stage DM7 and DM8, by simply realizing the transistors M0 and M1 with a high voltage fabrication technology. According to a preferred embodiment of the invention, the MOS transistors M5 and M3 are made equal to one another.

Figure 1:
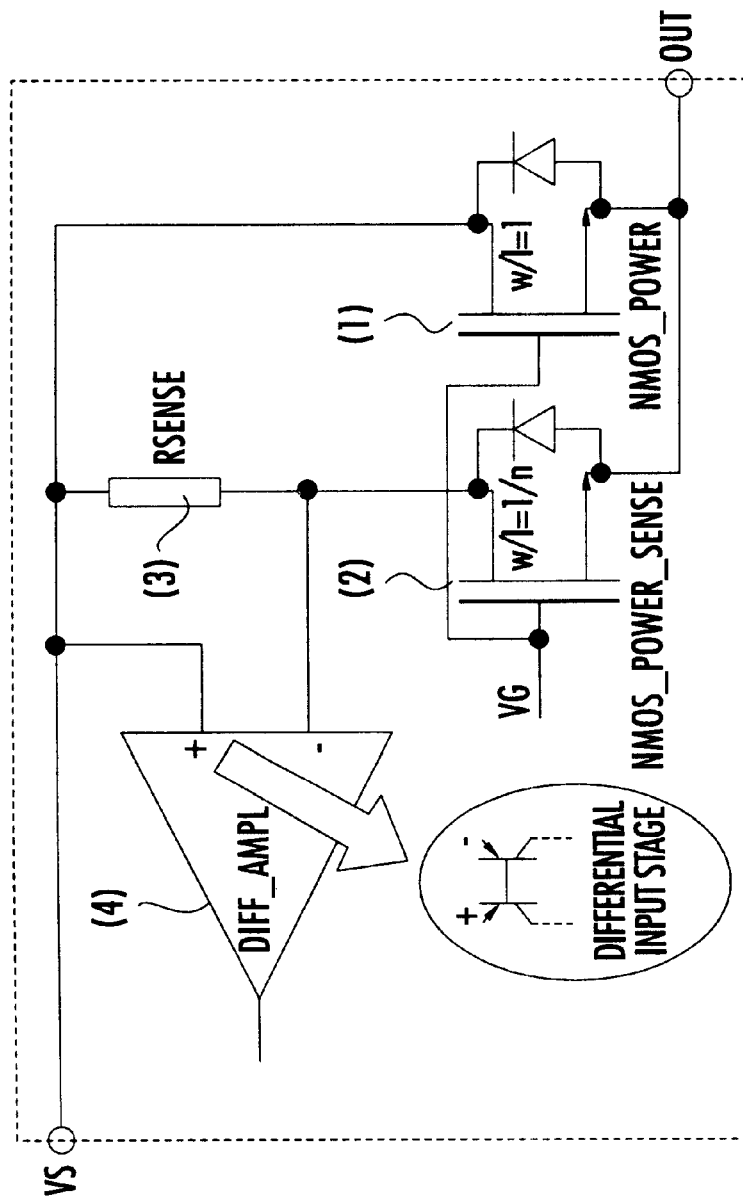
FIG. 1 is schematic diagram of a prior art circuit for monitoring the current circulating in a load.
Figure 2:
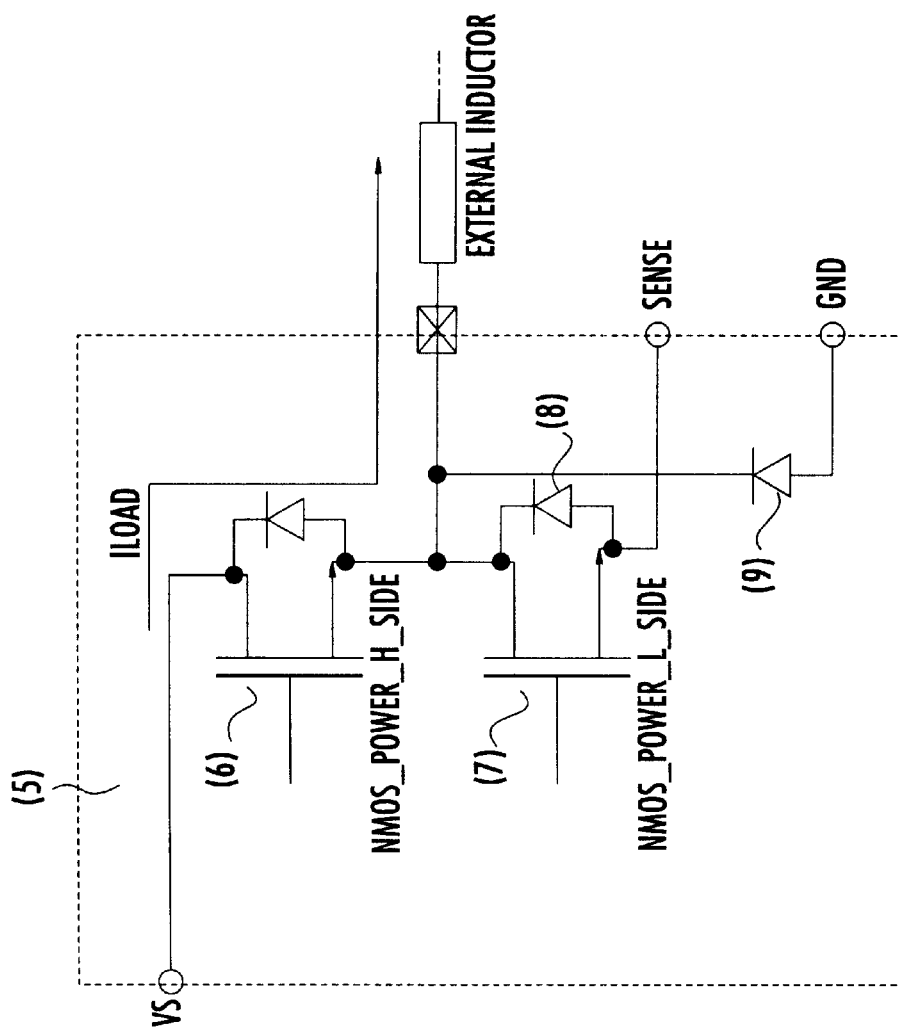
FIG. 2 is schematic diagram of a prior art half-bridge scheme used for driving a load.

By exploiting a self-biasing technique, the circuit of the invention has a fast dynamic response, a power consumption proportional to the current circulating in DMOS 11, a very small offset despite a not very large gain, and a compensation with dominant pole at high frequency. Circuit 13 is a self-biased CMOS circuit, i.e. a current that is always proportional to the load current circulating in its branches. This characteristic procures the following advantages:

Under conditions of null load, i.e. with Iload=0, the current absorption of the disturbances attenuating circuit is null;

the self-biasing technique keeps the gate voltages of the stages formed by M0, M1, M2 and M3 at the same value for relatively low offset at the input of the integrated device 13 even with only one gain stage;

compensation of the gain stage may be obtained using only one low voltage capacitance between the drain of M2 and ground, allowing for an enhanced immunity from noise coming from the supply rails;

apart from the input stage formed by M4, M5 and M6 (FIG. 6) and from the cascode stages formed by the DMOS transistors DM7 and DM8, the whole stage is made with low voltage components;

ease of correction of the ratio between Iref and the load current, by varying n and m, which are the area ratios between transistors 11 and 12 and of M1 and M0, respectively, it is possible to finely adjust the ratio;

immunity from substrate noise greater than that of the prior art approach of FIG. 1, because the amplifier is of CMOS type instead of been customarily made with devices bipolar inputs.

Figure 3:
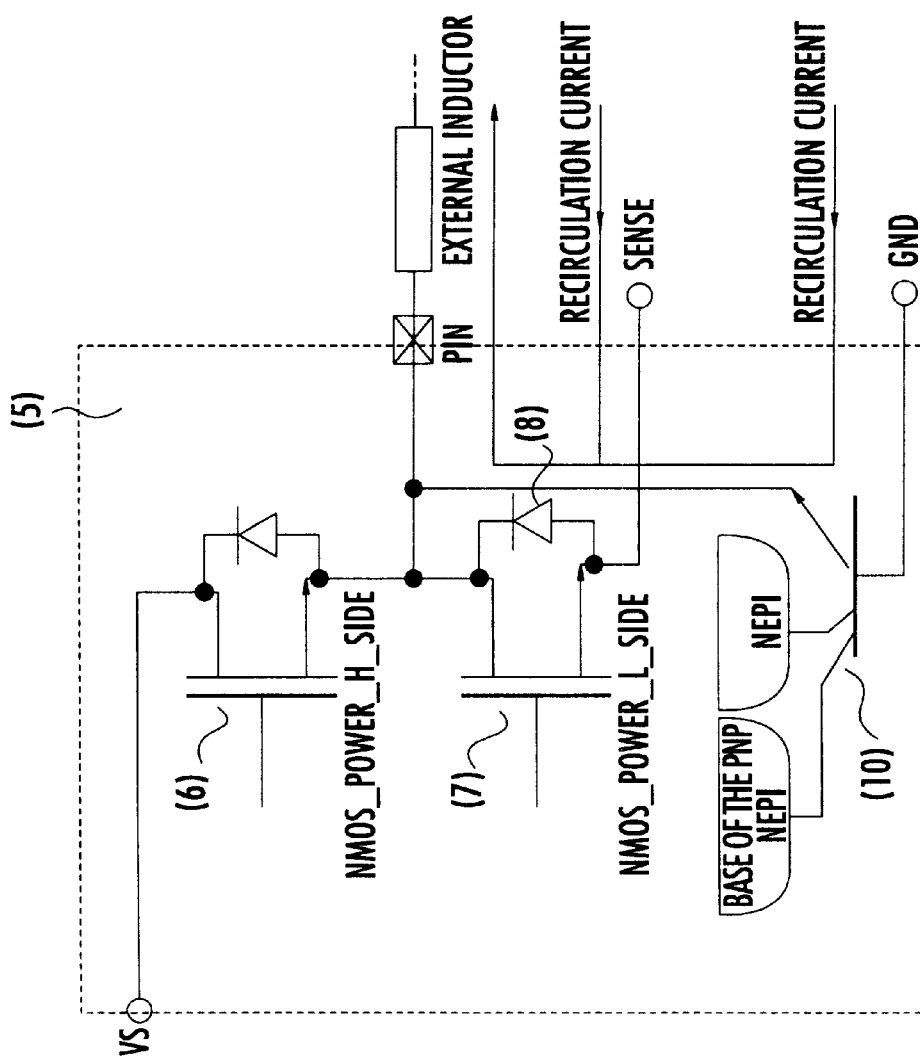
Figure 4:
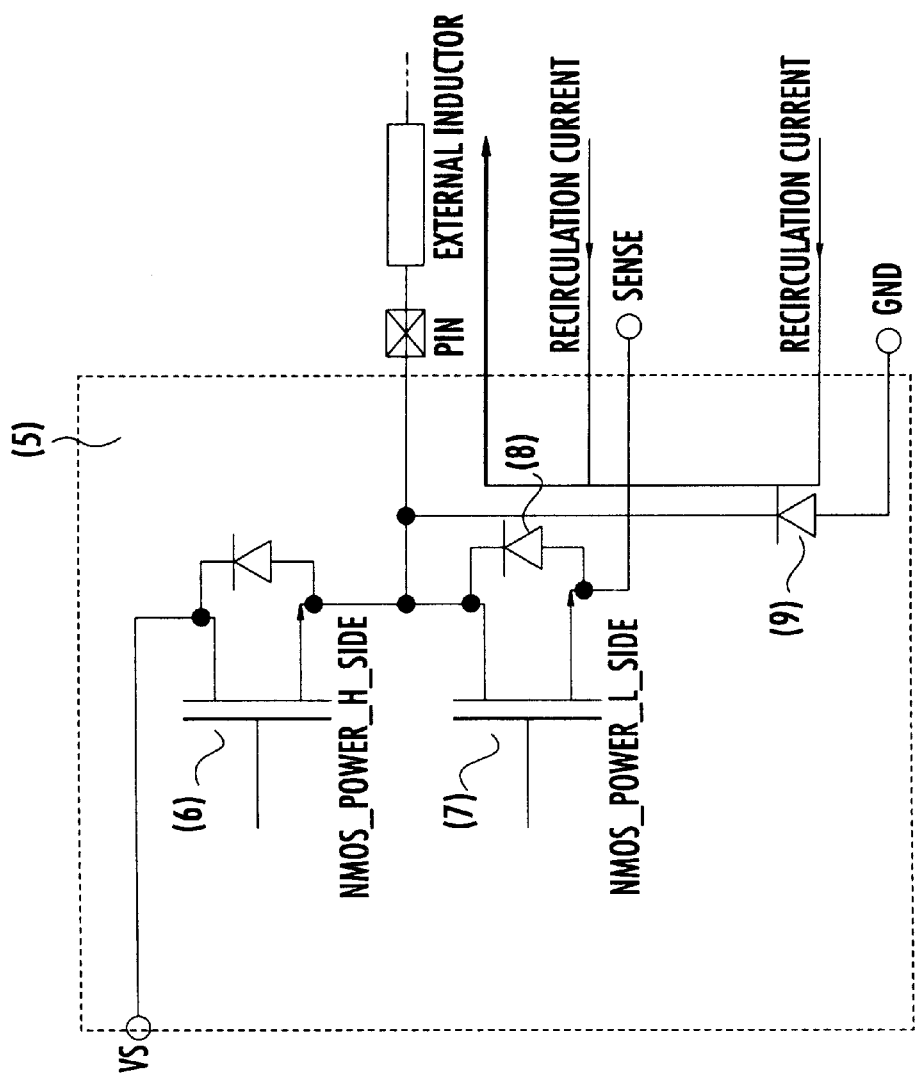
FIG. 4 is schematic diagram showing the paths of the recirculation currents of the circuit of FIG. 2.
Figure 5:
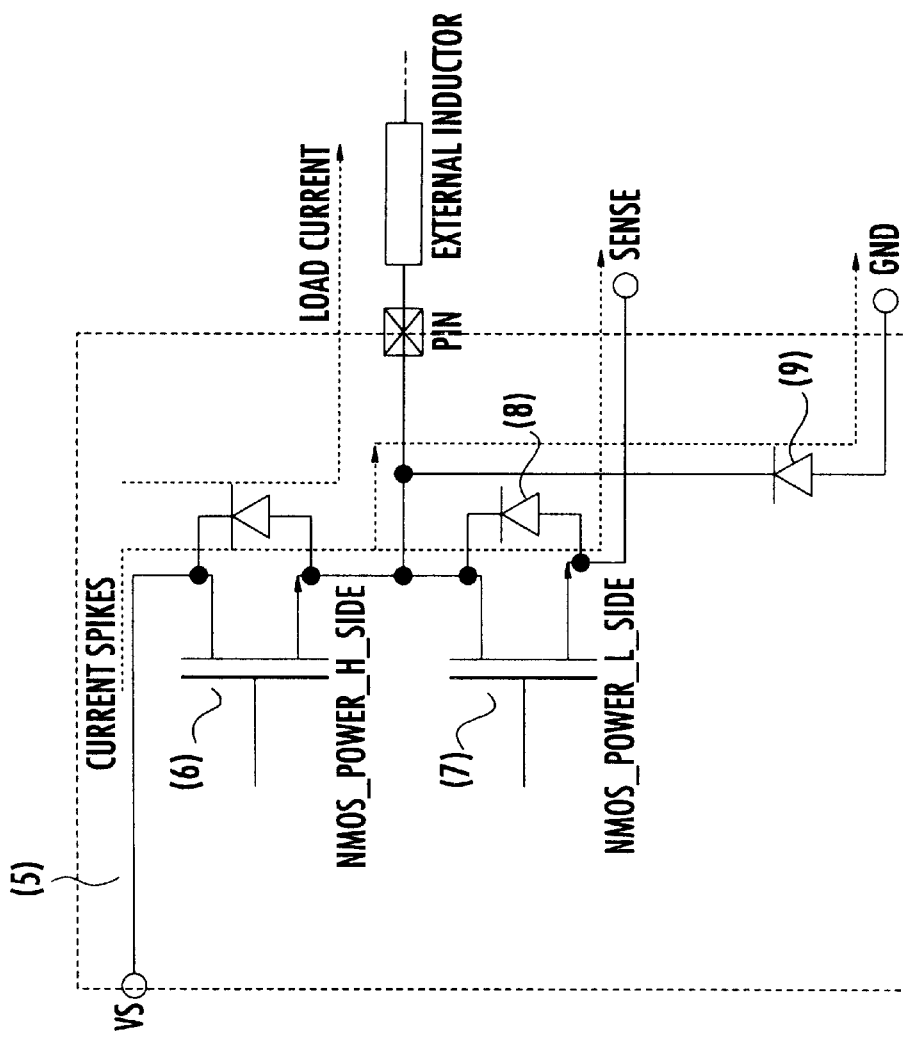
FIG. 5 is schematic diagram of a prior art illustrating the mechanism that generates current spikes in the circuit of FIG. 2.
Figure 7:
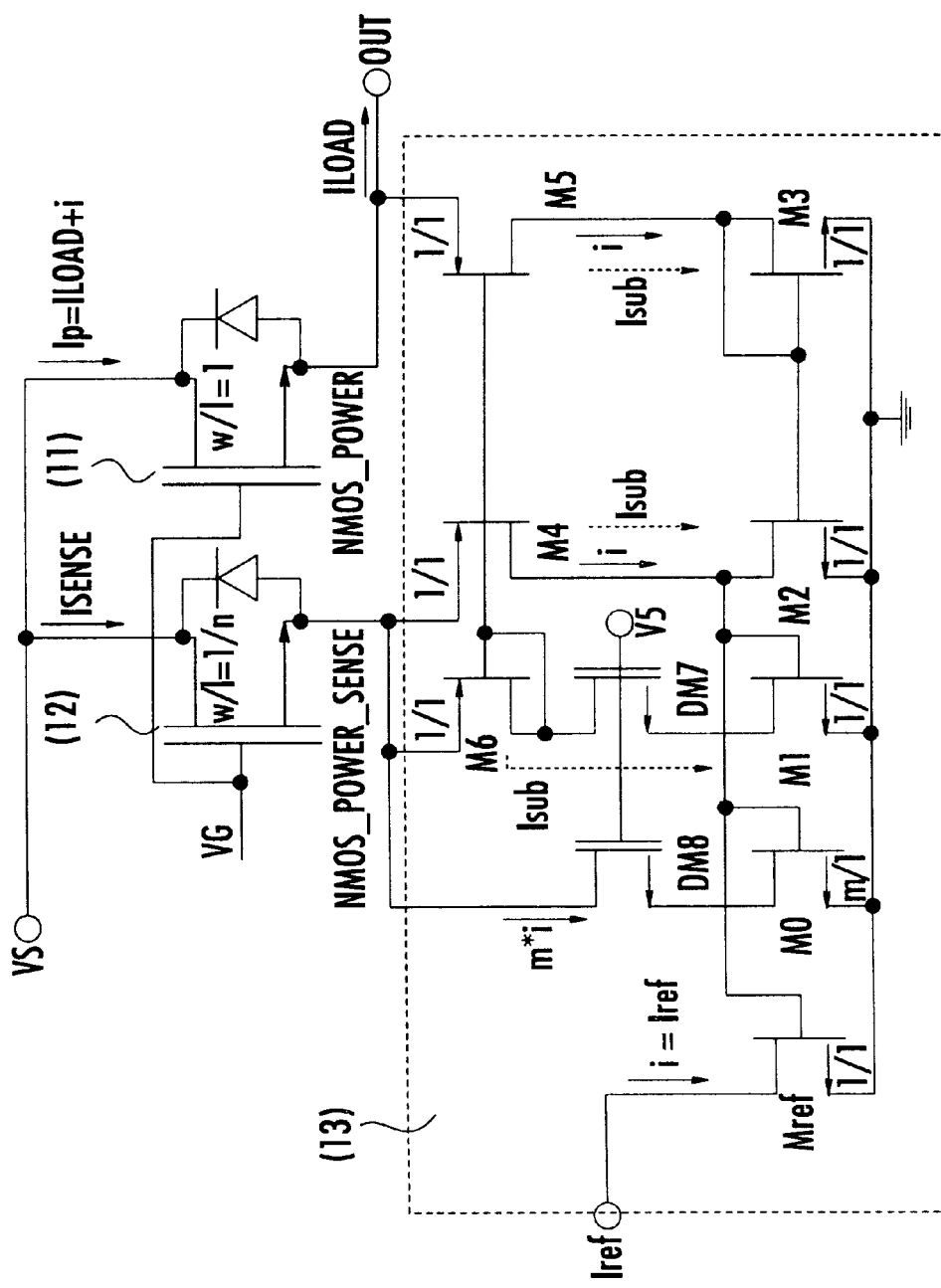
FIGS. 7 and 8 are schematic diagrams illustrating the effect in the circuit of FIG. 6 of the injection by the cascode stage DM7, DM8 of a substrate current.

In the circuit of this invention the only points subjected to noise, i.e. the epitaxial regions of the DMOS transistors on the substrate, are the drains of the devices DM7 and DM8 (FIG. 6). A noise on the drain of DM7, as for example a current injected into the substrate by the parasitic NPN transistor 10 of FIG. 3, increases the current circulating in the cascode stage by a quantity Isub, as shown in FIG. 7. Such a disturbance is of a common mode nature for the input pair of the differential stage formed by M4 and M5 and therefore differently from the prior art circuit of FIG. 1 it is not amplified, but is simply output by the transistor MREF.

Figure 8:
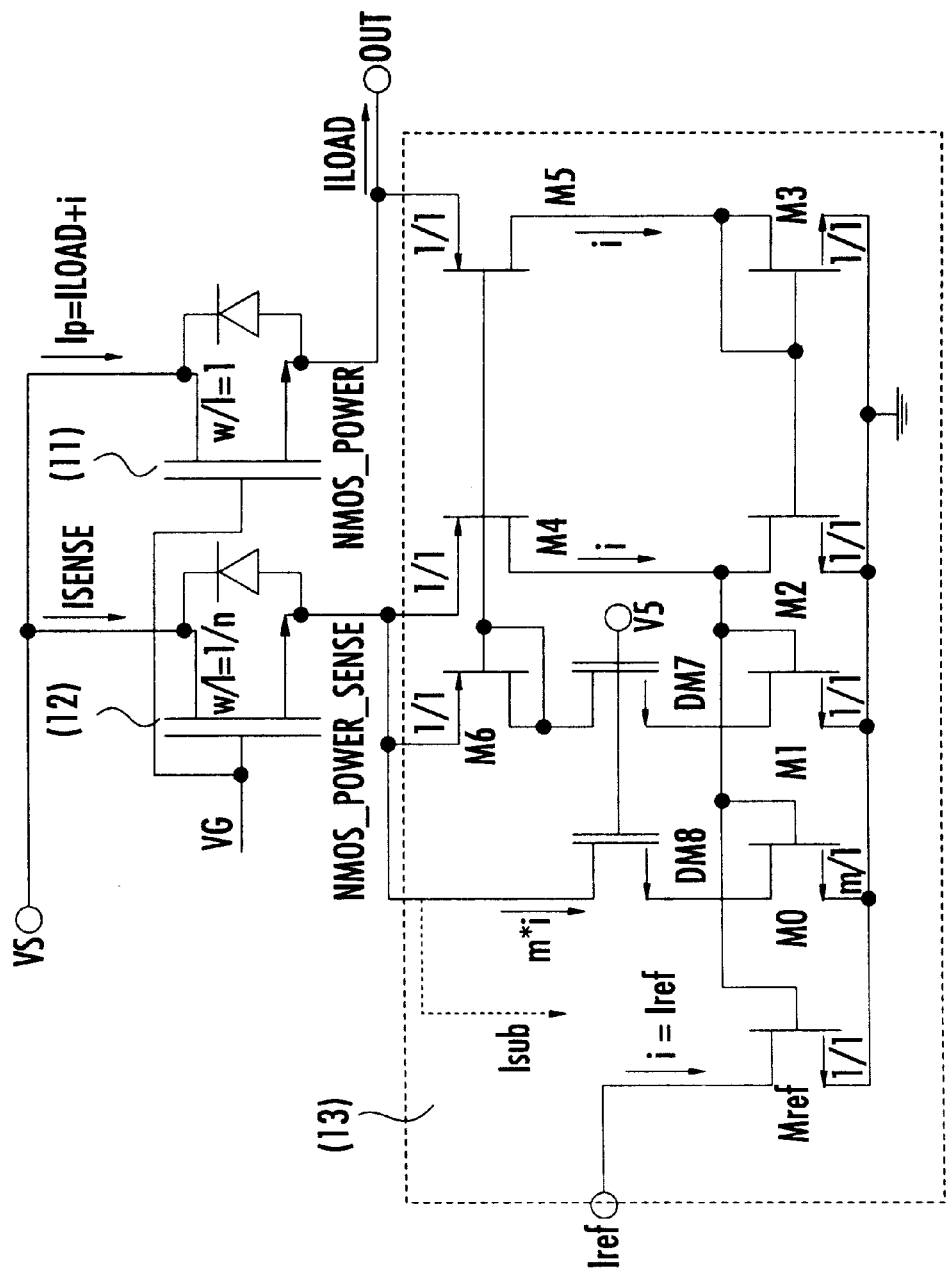

A current towards the substrate in the drain of DM8 produces the effect illustrated in FIG. 8. Since the current Isub flows towards the substrate from the drain of DM8, it may be stated that the current Iref is:

$$Iref=i=((Iload+i)/n-Isub)/(m+2)$$

A substrate current in DM8 produces a variation of Iref that is reduced by a factor m+2, and is not amplified as in the case of a PNP input stage of the prior art circuit of FIG. 1. Therefore an extremely large parasitic current would be necessary for producing a relevant variation of Iref.

Figure 9:
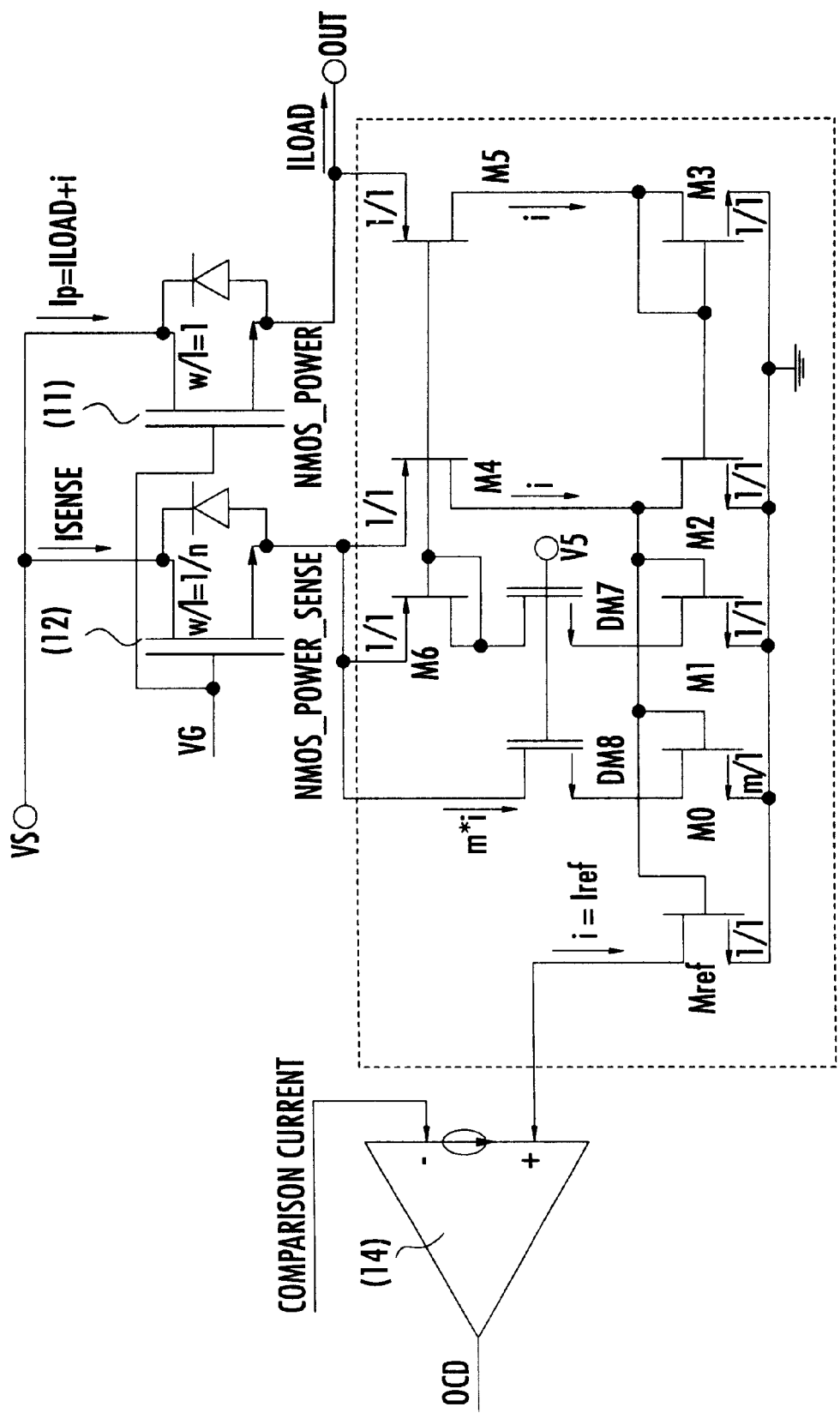
FIG. 9 is a schematic diagram depicting a system of the invention for detecting overcurrents.

The circuit of this invention may be useful in different applications, such as in systems for detecting overcurrents and in control loops for regulating the current delivered to a load. A system of the invention for detecting an overcurrent may be easily realized using a current comparator 14 in cascade to the above described disturbances attenuating circuit, as shown in FIG. 9. The current Iref is compared with a threshold current of the comparator outputting a digital signal OCD that may be used as:

1. Overcurrent Detection signal, indicating that the current circulating in the transistor POWER_H_SIDE oversteps a certain pre-established guard value; and/or
2. Trigger signal (Current Detection) for implementing a PWM or similar technique for controlling the current flowing in the power switching devices.

Figure 10:
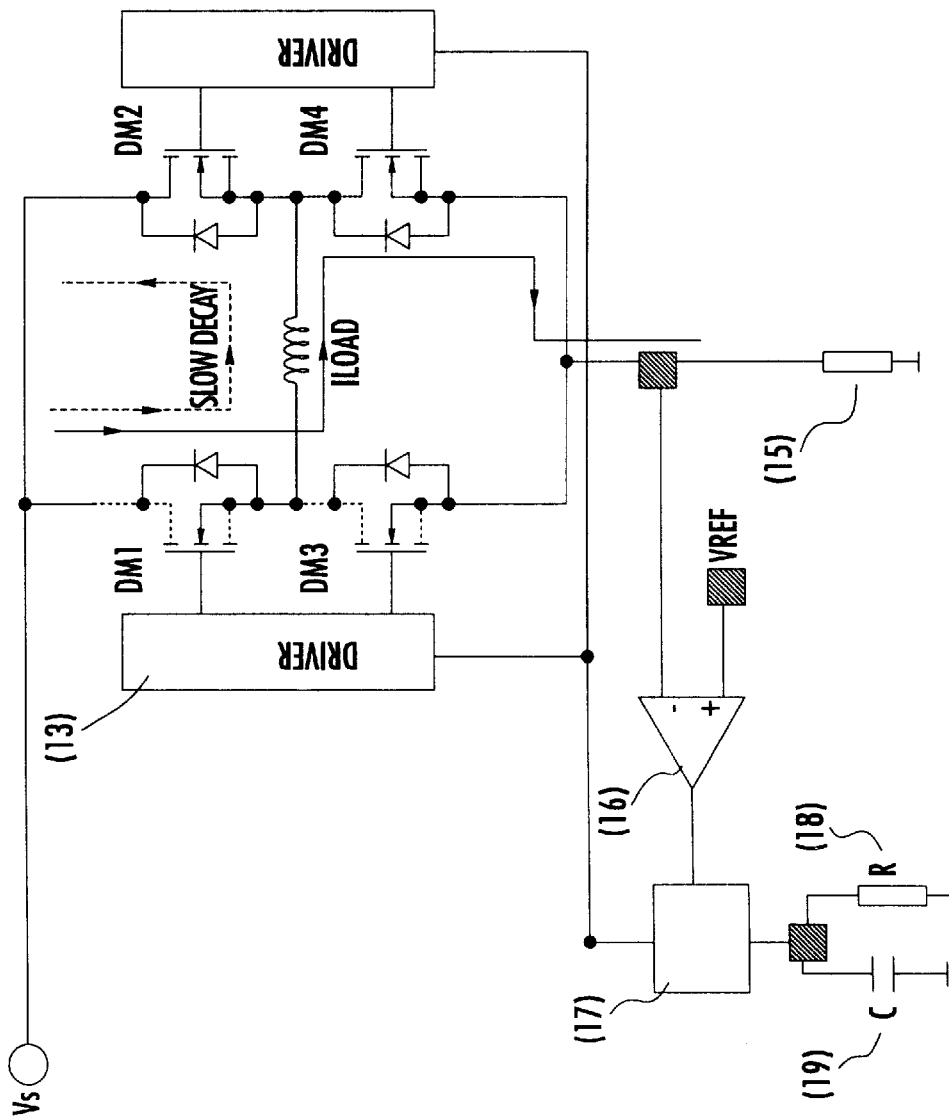
FIG. 10 is a schematic diagram depicting of a known circuit for driving a load in a PWM mode.

For example, as depicted in FIG. 10, in known devices for controlling the operation of a motor ("Motor Control"), a configuration that is often employed uses a full-bridge stage driving the inductive load, wherein the peak of the current provided to the load is controlled. The turning on of the DMOS transistors DM1 and DM4 (DM2 and DM3), increases the current in the inductive load in the direction as shown in the figure. In known devices, the current is converted in a voltage signal on a sensing resistance 15 and the signal is compared with a reference voltage Vref by the comparator 16. When the voltage on 15 oversteps the reference value, the comparator drives an astable circuit 17 for generating a constant time interval programmable by sizing the resistance 18 and the capacitance 19, during which the DMOS M4 (M3) is turned off and the current recirculates in the DMOS M2 (M1).

This configuration is burdensome and poorly efficient because it requires a precise sensing resistance 15 of a relatively small value and with adequate power dissipating properties because the load current circulates in it. Moreover a fast comparator 16 with a small offset is needed.

Figure 11:
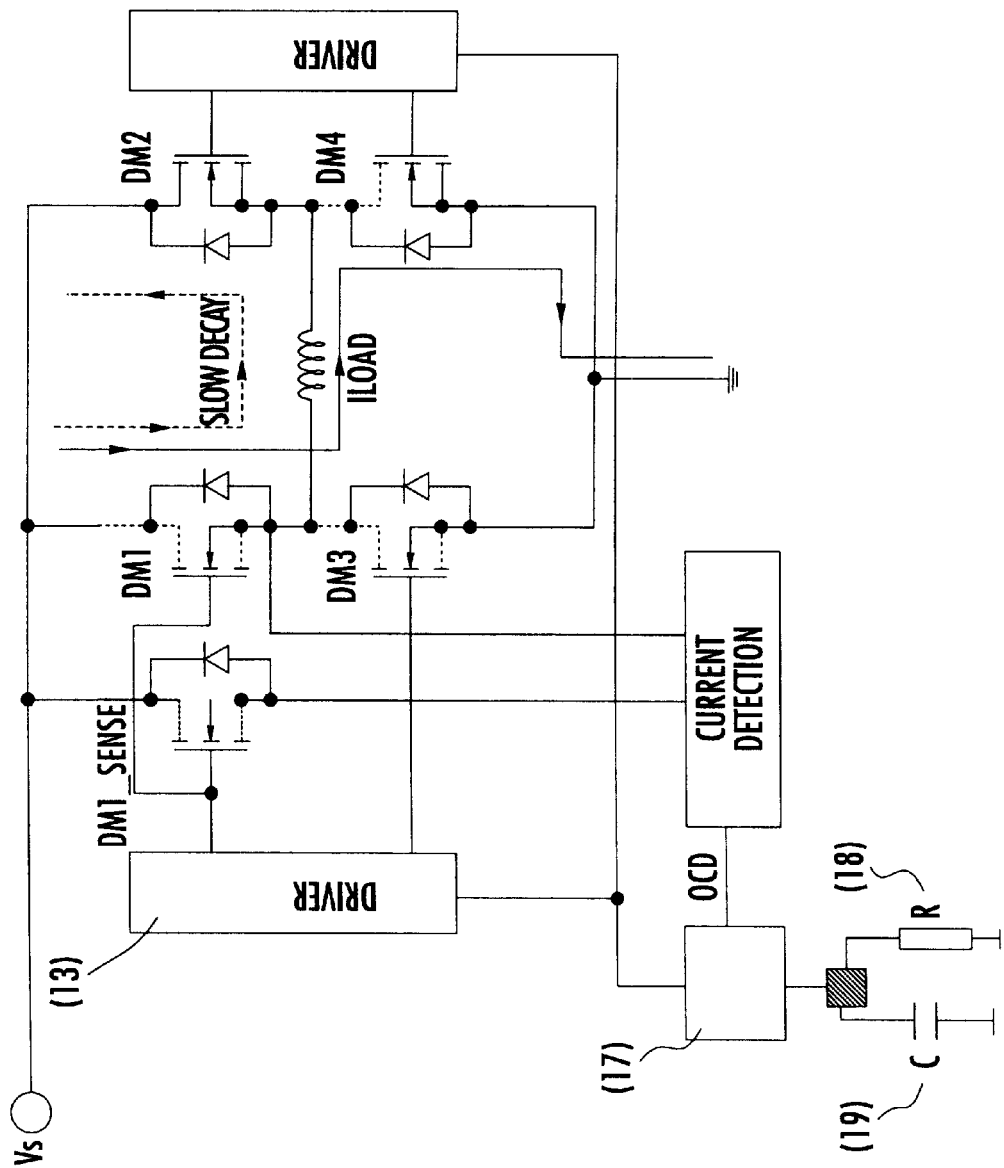
FIG. 11 is a schematic diagram illustrating the device of FIG. 9 driving a load in a PWM mode.

If instead, the circuit Current Detection (FIG. 11) that drives the astable circuit 17 is exploited for detecting the current circulating in the load through the DMOS M1, it is possible to avoid the use of an external resistance 15 and of the comparator 16. This approach is far more effective and less burdensome than the approach of FIG. 10.

Figure 12:
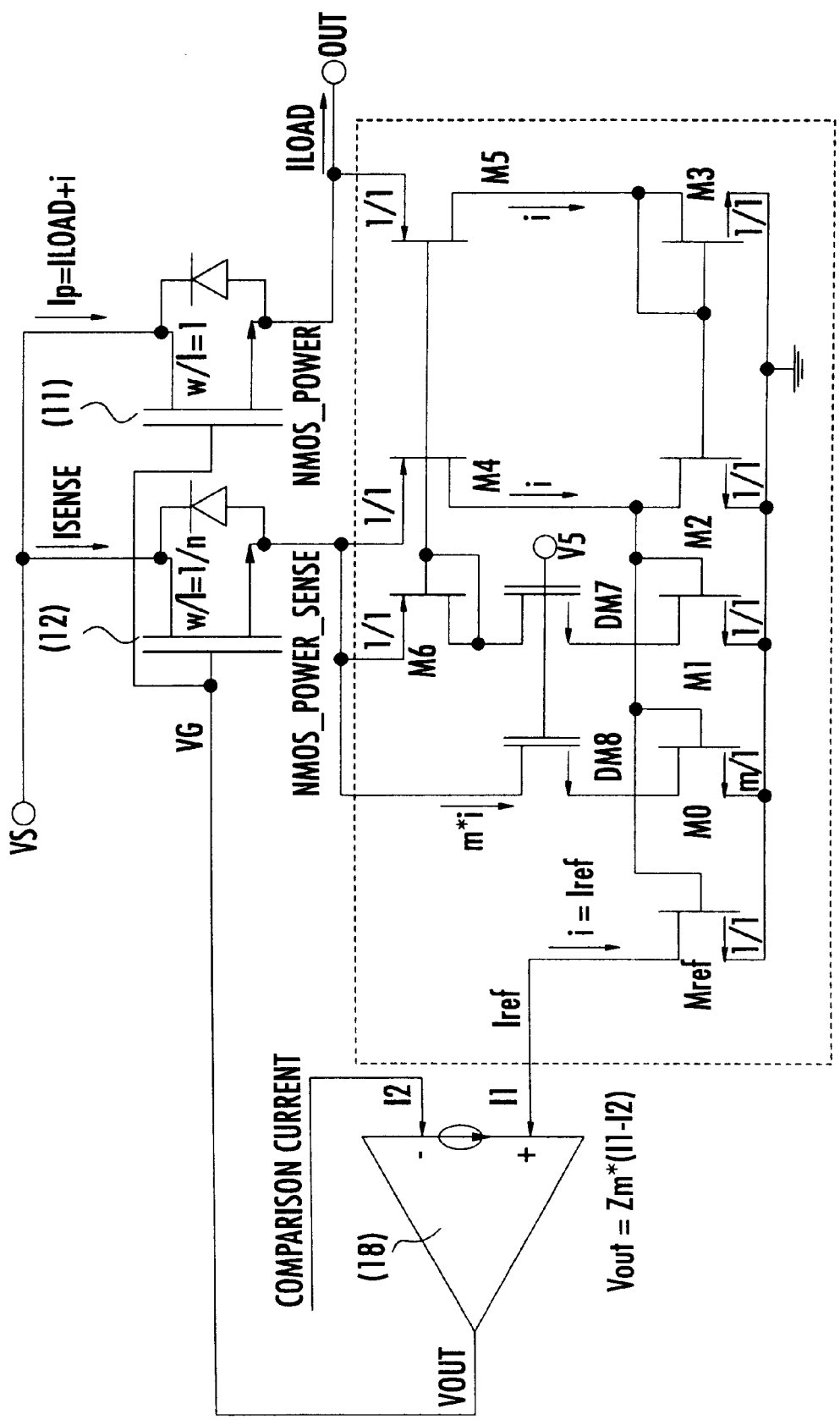
FIG. 12 is a schematic diagram showing a current regulating system of the invention.

By using a trans-impedance amplifier ZM 18, a system for regulating the current delivered to the load can be realized, as shown in FIG. 12. The trans-impedance amplifier is input with the current Iref produced by the disturbances attenuating circuit and with a reference current I2, and outputs a regulation voltage of the DMOS transistors 11 and 12 as a function of the difference between Iref and I2. This regulation voltage may be used for:

1. implementing a current mode linear protection for linear regulators; and/or
2. implementing a current mode controlled turning on of a Power DMOS in switching devices.

That which is claimed is:

1. A circuit for monitoring the current delivered to a load through an output node of a power transistor comprising:
    a sense transistor that produces, on a sensing node, a scaled-down replica current of the current being delivered through the power transistor; and
    a disturbances attenuating circuit connected to the sense transistor and the power transistor and including
        a differential stage including a first pair of identical transistors coupled to the output node and to the sensing node, respectively, and having control terminals connected in common, and a load current mirror including a second pair of identical transistors coupled to a reference voltage,
        a first stage, a second stage and a third stage referenced to the reference voltage, the respective input nodes of which are connected in common to an output node of the differential stage,
        the first stage comprising a first transistor identical to the second pair of transistors of the load current mirror, and a diode-connected load transistor identical to the first pair of transistors of the differential stage and forming with them a current mirror referenced to the sensing node,
        the second stage comprising a second transistor coupled to the sensing node and having a size that is a multiple of the size of the first transistor of the first stage, and
        the third stage comprising a third transistor identical to the first transistor of the first stage and delivering a current signal proportional to the current being delivered to the load.

2. The circuit of claim 1, further comprising respective cascode stages coupling the first and second stages to the diode-connected transistor and to the sensing node.

3. The circuit of claim 2, wherein each of the respective cascode stages comprises a transistor with a control terminal coupled to a bias voltage.

4. The circuit of claim 3, wherein the transistors of the cascode stages comprise identical MOS transistors.

5. The circuit of claim 1, wherein all transistors are MOS transistors.

6. The circuit of claim 1, wherein the first and second pairs of transistors of the differential stage are identical.

7. A system for detecting overcurrents in a load and producing a logic signal when a current larger than a pre-established value circulates in the load, the system comprising:
    a power transistor for delivering the current to the load;
    a sense transistor producing, on a sensing node, a scaled-down replica current of the current delivered through the power transistor;

a circuit connected to the sense transistor and the power transistor for monitoring the current provided to the load and comprising a differential stage including a first pair of identical transistors coupled to the output node and to the sensing node, respectively, and having control terminals connected in common, and a load current mirror including a second pair of identical transistors coupled to a reference voltage, a first stage, a second stage and a third stage referenced to the reference voltage, the respective input nodes of which are connected in common to an output node of the differential stage, the first stage comprising a first transistor identical to the second pair of transistors of the load current mirror, and a diode-connected load transistor identical to the first pair of transistors of the differential stage and forming with them a current mirror referenced to the sensing node, the second stage comprising a second transistor coupled to the sensing node and having a size that is a multiple of the size of the first transistor of the first stage, and the third stage comprising a third transistor identical to the first transistor of the first stage and delivering a current signal proportional to the current being delivered to the load; and a current comparator for receiving a comparison current on a first input and the current signal produced by the monitoring circuit on a second input for producing the logic signal.

8. The system of claim 7, further comprising respective cascode stages coupling the first and second stages to the diode-connected transistor and to the sensing node.

9. The system of claim 8, wherein each of the respective cascode stages comprises a transistor with a control terminal coupled to a bias voltage.

10. The system of claim 9, wherein the transistors of the cascode stages comprise identical MOS transistors.

11. The system of claim 7, wherein all transistors of the monitoring circuit are MOS transistors.

12. The system of claim 7, wherein the first and second pairs of transistors of the differential stage are identical.

13. The system of claim 7, wherein the power transistor defines a part of a half-bridge of a full-bridge stage driving the load.

14. The system of claim 13, wherein the load is a winding of an electric motor.

15. A system for regulating a current delivered to a load through a power transistor in association with a sense transistor producing, on a sensing node, a scaled-down replica current of the current delivered by the power transistor, the system comprising:

a circuit connected to the sense transistor and the power transistor for monitoring the current provided to the load and comprising a differential stage including a first pair of identical transistors coupled to the output node and to the sensing node, respectively, and having control terminals connected in common, and a load current mirror including a second pair of identical transistors coupled to a reference voltage, a first stage, a second stage and a third stage referenced to the reference voltage, the respective input nodes of which are connected in common to an output node of the differential stage, the first stage comprising a first transistor identical to the second pair of transistors of the load current mirror, and a diode-connected load transistor identical to the first pair of transistors of the differential stage and forming with them a current mirror referenced to the sensing node, the second stage comprising a second transistor coupled to the sensing node and having a size that is a multiple of the size of the first transistor of the first stage, and the third stage comprising a third transistor identical to the first transistor of the first stage and delivering a current signal proportional to the current being delivered to the load; and a trans-impedance amplifier receiving a comparison current and the current signal produced by the monitoring circuit, and for outputting a regulation voltage signal that is applied on the control node of the power transistor.

16. The system of claim 15, further comprising respective cascode stages coupling the first and second stages to the diode-connected transistor and to the sensing node.

17. The system of claim 16, wherein each of the respective cascode stages comprises a transistor with a control terminal coupled to a bias voltage.

18. The system of claim 17, wherein the transistors of the cascode stages comprise identical MOS transistors.

19. The system of claim 15, wherein all transistors of the monitoring circuit are MOS transistors.

20. The system of claim 15, wherein the first and second pairs of transistors of the differential stage are identical.

21. A method for monitoring the current delivered to a load through an output node of a power transistor comprising:

producing, on a sensing node, a scaled-down replica current of the current being delivered through the power transistor; and attenuating disturbances to the power transistor by providing a differential stage including a first pair of identical transistors coupled to the output node and to the sensing node, respectively, and having control terminals connected in common, and a load current mirror including a second pair of identical transistors coupled to a reference voltage, a first stage, a second stage and a third stage referenced to the reference voltage, the respective input nodes of which are connected in common to an output node of the differential stage, the first stage comprising a first transistor identical to the second pair of transistors of the load current mirror, and a diode-connected load transistor identical to the first pair of transistors of the differential stage and forming with them a current mirror referenced to the sensing node, the second stage comprising a second transistor coupled to the sensing node and having a size that is a multiple of the size of the first transistor of the first stage, and the third stage comprising a third transistor identical to the first transistor of the first stage and delivering a current signal proportional to the current being delivered to the load.

22. The method of claim 21, further comprising coupling the first and second stages to the diode-connected transistor and to the sensing node with respective cascode stages.

23. The method of claim 22, wherein each of the respective cascode stages comprises a transistor with a control terminal coupled to a bias voltage.

24. The method of claim 23, wherein the transistors of the cascode stages comprise identical MOS transistors.

25. The method of claim 21, wherein all transistors are MOS transistors.

26. The method of claim 21, wherein the first and second pairs of transistors of the differential stage are identical.

* * * * *